United States Patent
Yin et al.

(10) Patent No.: US 10,785,434 B2
(45) Date of Patent: Sep. 22, 2020

(54) VISIBLE LIGHT COMMUNICATION SENSOR

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW)

(73) Assignee: Guangzhou Tyrafos Semiconductor Technologies CO., LTD, Guangzhou (CN)

( * ) Notice: Subject to any disclaimer, the term of this patent is extended or adjusted under 35 U.S.C. 154(b) by 0 days.

(21) Appl. No.: 16/507,044

(22) Filed: Jul. 10, 2019

(65) Prior Publication Data

US 2020/0021360 A1     Jan. 16, 2020

Related U.S. Application Data

(60) Provisional application No. 62/696,322, filed on Jul. 10, 2018.

(51) Int. Cl.
*H04B 10/00*  (2013.01)
*H04N 5/3745* (2011.01)
(Continued)

(52) U.S. Cl.
CPC ....... *H04N 5/37452* (2013.01); *G01N 21/554* (2013.01); *G01N 21/645* (2013.01);
(Continued)

(58) Field of Classification Search
CPC .............................. H04B 10/116; H04N 5/378
See application file for complete search history.

(56) References Cited

U.S. PATENT DOCUMENTS

| | | | |
|---|---|---|---|
| 9,450,671 B2 * | 9/2016 | Chen .................... | H04B 10/116 |
| 10,038,500 B1 * | 7/2018 | Kadambala .......... | H04B 10/116 |

(Continued)

OTHER PUBLICATIONS

"Office Action of Taiwan Counterpart Application", dated Feb. 26, 2020, p. 1-p. 9.
(Continued)

*Primary Examiner* — David C Payne
*Assistant Examiner* — Pranesh K Barua
(74) *Attorney, Agent, or Firm* — JCIPRNET

(57) ABSTRACT

A visible light communication sensor is provided. The visible light communication sensor includes a sensing module, an image data readout circuit, and a visible light communication data readout circuit. The sensing module includes a plurality of pixel units arranged in an array. When the sensing module performs an image sensing operation, a first portion of the pixel units performs an image sensing operation, and the image data readout circuit is idle. When the sensing module performs a visible light communication operation, a second portion of the plurality of pixel units receives a visible light communication signal, so that the visible light communication data readout circuit outputs the visible light communication data, and the image data readout circuit performs an analog-to-digital conversion on a plurality of image sensing signals outputted by the first portion of the plurality of pixel units performed in the image sensing operation to output image sensing data.

7 Claims, 2 Drawing Sheets

(51) Int. Cl.

| | | |
|---|---|---|
| *G01N 21/552* | (2014.01) | |
| *G01N 21/64* | (2006.01) | |
| *G02B 5/22* | (2006.01) | |
| *G02B 5/28* | (2006.01) | |
| *H01L 31/112* | (2006.01) | |
| *H04B 10/116* | (2013.01) | |
| *H04L 7/00* | (2006.01) | |
| *H04N 5/353* | (2011.01) | |
| *H04N 5/369* | (2011.01) | |
| *H04N 5/378* | (2011.01) | |
| *H04N 9/04* | (2006.01) | |

(52) U.S. Cl.
CPC ............... *G02B 5/22* (2013.01); *G02B 5/285* (2013.01); *H01L 31/1126* (2013.01); *H04B 10/116* (2013.01); *H04L 7/0075* (2013.01); *H04N 5/353* (2013.01); *H04N 5/3696* (2013.01); *H04N 5/378* (2013.01); *H04N 9/045* (2013.01); *G01N 2201/064* (2013.01)

(56) References Cited

U.S. PATENT DOCUMENTS

| | | | |
|---|---|---|---|
| 10,193,627 B1* | 1/2019 | Herman | H04B 10/116 |
| 10,348,404 B1* | 7/2019 | Herman | H04B 10/116 |
| 2004/0032626 A1* | 2/2004 | Rossi | H04N 5/3653 |
| | | | 358/504 |
| 2015/0304580 A1* | 10/2015 | Wang | H04N 5/378 |
| | | | 348/302 |
| 2016/0065872 A1* | 3/2016 | Yin | H04N 5/378 |
| | | | 348/308 |
| 2017/0195604 A1* | 7/2017 | Shen | H04N 5/35581 |
| 2019/0333494 A1* | 10/2019 | Park | H04R 1/406 |

OTHER PUBLICATIONS

Chih-Hao Lin, et al., "A Dual-Mode CMOS Image Sensor for Optical Wireless Communication", The 2014 International Symposium on VLSI Design, Apr. 28-30, 2014.

Dilukshan Karunatilaka, et al., "LED Based Indoor Visible Light Communications: State of the Art", The IEEE Communication Surveys & Tutorials, vol. 17, No. 3, Third Quarter 2015.

* cited by examiner

VISIBLE LIGHT COMMUNICATION SENSOR

CROSS-REFERENCE TO RELATED APPLICATION

This application claims the priority benefit of U.S. provisional application Ser. No. 62/696,322, filed on Jul. 10, 2018. The entirety of the above-mentioned patent application is hereby incorporated by reference herein and made a part of this specification.

BACKGROUND

Technical Field

The present disclosure relates to a communication technology, and in particular to a visible light communication sensor.

Description of Related Art

With the evolution of wireless communication technology, the use of visible light for message transmission is one of the important field requiring research and development of the wireless communication industry. Visible Light Communication (VLC) technology can be applied to, for example, various fields such as light fidelity, visible light video on demand services, visible light wireless broadcasting or visible light positioning, and has the advantages of high energy efficiency, low electromagnetic interference, and development of new spectrum. However, it remains an issue to find out how to integrate visible light communication technology into existing specific functional components of current electronic products to increase the applicability of visible light communication. Therefore, some embodiments as the solutions for making the specific functional components of the electronic product integrated with the visible light communication function to perform its existing functions normally, and also effectively and accurately sense the visible light signal are proposed below.

SUMMARY

The disclosure provides a visible light communication sensor, which can integrate an image sensor to provide image sensing function and visible light communication function.

The visible light communication sensor of the present disclosure includes a sensing module, an image data readout circuit and a visible light communication data readout circuit. The sensing module includes a plurality of pixel units arranged in an array. The image data readout circuit is coupled to the first portion of the plurality of pixel units. The visible light communication data readout circuit is coupled to the second portion of the plurality of pixel units. When the sensing module performs an image sensing operation, the first portion of the plurality of pixel units performs image sensing, and the image data readout circuit is idle. When the sensing module performs the visible light communication operation, the second portion of the plurality of pixel units receives the visible light communication signal, so that the visible light communication data readout circuit outputs the visible light communication data, and the image data readout circuit performs an analog-to-digital conversion on the plurality of image sensing signals outputted by the first portion of the plurality of pixel units performed in the image sensing operation to output an image sensing data.

In an embodiment of the disclosure, the visible light communication data readout circuit includes a comparator and a synchronization circuit. The synchronization circuit is coupled to the output terminal of the comparator. The second portion of the plurality of pixel units is coupled to the first input terminal of the comparator. When the sensing module performs a visible light communication operation, the second portion of the plurality of pixel units outputs the plurality of visible light sensing signals to the comparator according to the visible light communication signal, so that the comparator and the synchronous circuit read out the visible light communication data.

In an embodiment of the disclosure, the first portion of the plurality of pixel units includes the second portion of the plurality of pixel units. The sensing module alternately performs the image sensing operation and the visible light communication operation.

In an embodiment of the disclosure, the sensing module alternately performs the image sensing operation and the visible light communication operation in the same frame time.

In an embodiment of the disclosure, the visible light communication sensor simultaneously outputs the visible light communication data and image sensing data.

In an embodiment of the disclosure, the first part of the plurality of pixel units is a plurality of first color type pixels. The second portion of the plurality of pixel units is a part of the plurality of first color type pixels.

In an embodiment of the disclosure, the first portion of the plurality of pixel units and the second portion of the plurality of pixel units operate independently of each other. The period in which the sensing module performs the image sensing operation is overlapped with the period in which the visible light communication operation is performed.

In an embodiment of the disclosure, the first portion of the plurality of pixel units is a part of the plurality of first color type pixels. The second portion of the plurality of pixel units is another portion of the plurality of first color type pixels.

Based on the above, the visible light communication sensor of the present disclosure can provide image sensing function and visible light communication function simultaneously or by time division by using the plurality of pixel units of the image sensor, and can effectively and accurately sense visible light signals.

In order to make the aforementioned features and advantages of the disclosure more comprehensible, embodiments accompanying figures are described in detail below.

DESCRIPTION OF THE EMBODIMENTS

Figure 1:
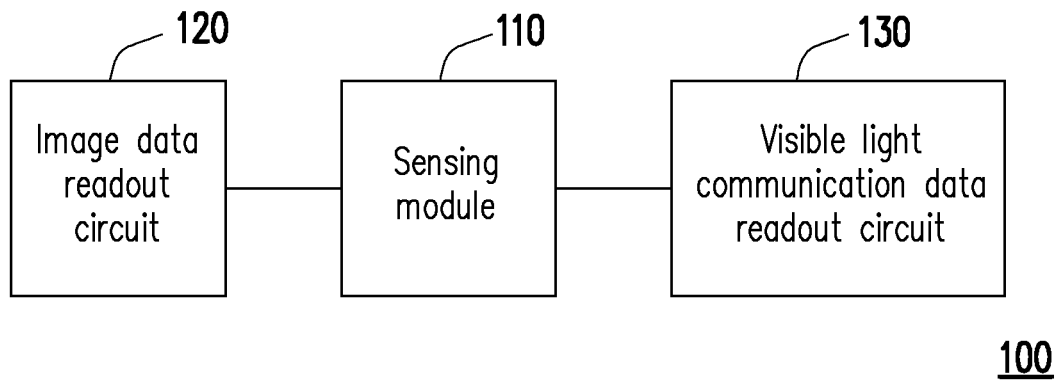
FIG. 1 is a functional block diagram of a visible light communication sensor according to an embodiment of the present disclosure.

In order to make the content of the present disclosure more comprehensible, specific embodiments as examples of the disclosure that can be actually implemented are provided below. In addition, wherever possible, elements/components/steps denoted by the same reference numerals in the drawings and the embodiments represent the same or similar parts.

FIG. 1 is a functional block diagram of a visible light communication sensor according to an embodiment of the present disclosure. Referring to FIG. 1, a visible light communication sensor 100 includes a sensing module 110, an image data readout circuit 120, and a visible light communication data readout circuit 130. In this embodiment, the visible light communication sensor 100 implements a visible light communication function and an image sensing function by applying an image sensor. The sensing module 110 can include a plurality of pixel units, and the plurality of pixel units are configured for image sensing operation. In an embodiment, the image sensor may be a complementary CMOS image sensor (CIS), and includes a plurality of pixel sensing units arranged in an array, but the disclosure is not limited thereto.

In this embodiment, the image data readout circuit 120 is coupled to at least a portion of the plurality of pixel units of the sensing module 110, and the visible light communication data readout circuit 130 is coupled to a portion of the plurality of pixel units of the sensing module 110. Therefore, when the sensing module 110 performs the image sensing operation, the at least a portion of the plurality of pixel units performs image sensing, and the image data readout circuit 120 and the visible light communication data readout circuit 130 are idle. However, when the sensing module 110 performs the visible light communication operation, a portion of the plurality of pixel units receives the visible light communication signal, so that the visible light communication data readout circuit 130 outputs the visible light communication data, and the image data readout circuit 120 performs analog-to-digital conversion on the plurality of image sensing signals outputted by the at least the portion of the plurality of pixel units performed in the image sensing operation to output the image sensing data. In other words, the visible light communication sensor 100 of the present embodiment can perform image sensing function and visible light communication signal sensing function by time division, and can simultaneously output the image sensing data and the visible light communication data.

Figure 2:
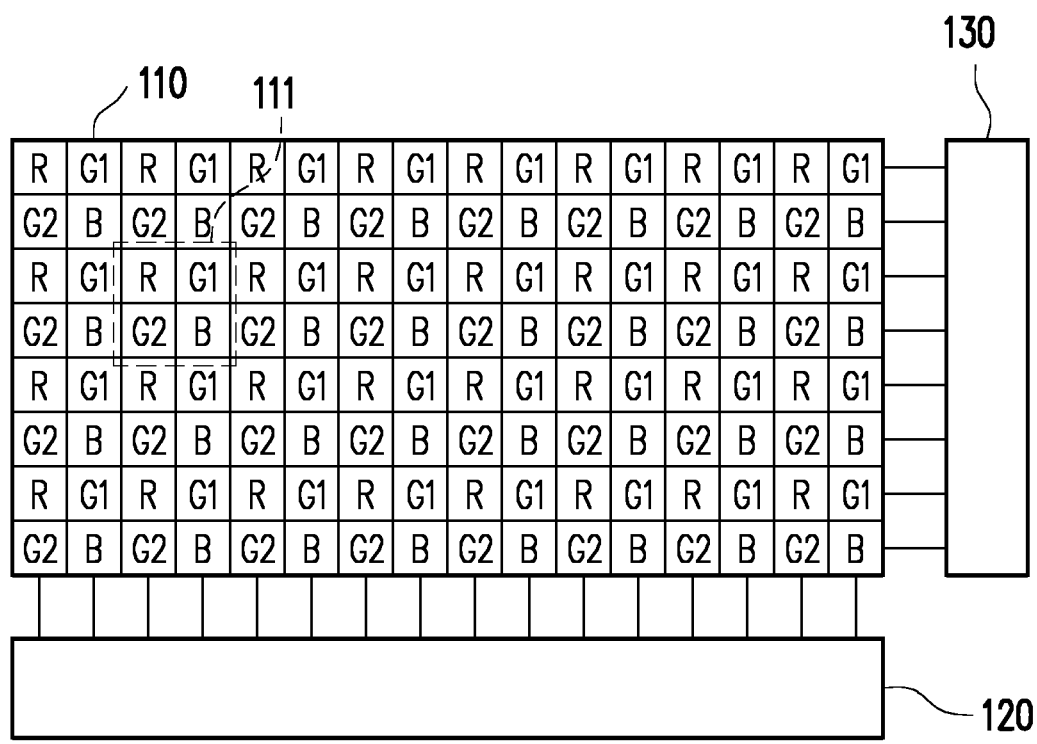
FIG. 2 is a schematic view of a structure of a visible light communication sensor according to the embodiment of FIG. 1 of the present disclosure.

FIG. 2 is a schematic view of a structure of a visible light communication sensor according to the embodiment of FIG. 1 of the present disclosure. Referring to FIG. 2, the sensing module 110 of the visible light communication sensor 100 may include a plurality of pixel units arranged in an array as shown in FIG. 2. The plurality of pixel units include a plurality of red pixel units R, a plurality of first green pixel units G1, a plurality of second green pixel units G2, and a plurality of blue pixel units B. In this embodiment, the plurality of red pixel units R, the plurality of first green pixel units G1, the plurality of second green pixel units G2, and the plurality of blue pixel units B are staggered. A red pixel unit R, a first green pixel unit G1, a second green pixel unit G2, and a blue pixel unit B are arranged in a square form to form a repeating unit 111, and the pixel unit array of the sensing module 110 may be formed by the plurality of repeating units 111 arranged in a repeated manner.

In the first embodiment, each of the plurality of pixel units of the sensing module 110 can be coupled to the image data readout circuit 120 respectively. The image data readout circuit 120 may include related circuit components such as an amplifier, a capacitor component, and a switch component, which should not be construed as a limitation to the present disclosure. The image data readout circuit 120 can be configured to read out the image sensing result of each of the plurality of pixel units of the sensing module 110. In the first embodiment, a portion of the plurality of pixel units of the sensing module 110 can be coupled to the visible light communication data readout circuit 130, respectively. The visible light communication data readout circuit 130 can be configured to read out the sensing result of the visible light communication signal of the portion of the plurality of pixel units of the sensing module 110.

Figure 3:
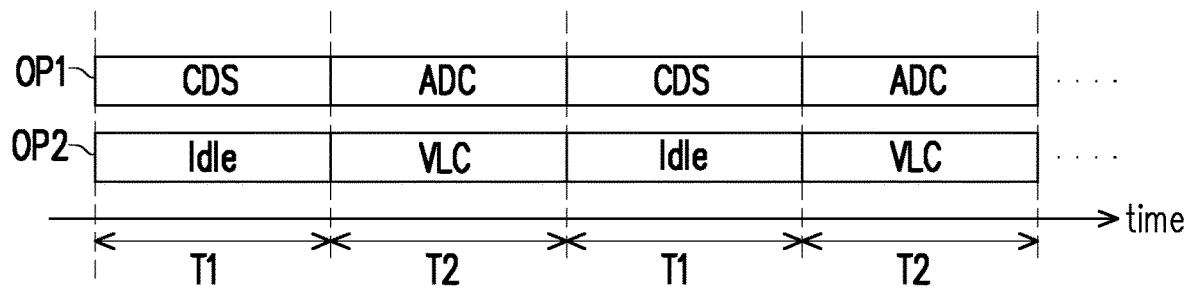
FIG. 3 is a timing diagram of performing an image sensing operation and a visible light communication operation according to a first embodiment of the present disclosure.

Further, FIG. 3 is a timing diagram of performing an image sensing operation and a visible light communication operation according to the first embodiment of the present disclosure. Referring to FIG. 2 and FIG. 3, in the first embodiment, the plurality of red pixel units R, the plurality of first green pixel units G1, the plurality of second green pixel units G2, and the plurality of blue pixel units B are configured for image sensing operation, and the plurality of red pixel units R, the plurality of first green pixel units G1, the plurality of second green pixel units G2, and the plurality of blue pixel units B can be further configured for the visible light communication signal sensing operation. Therefore, when the sensing module 110 performs the image sensing operation, the plurality of red pixel units R, the plurality of first green pixel units G1, the plurality of second green pixel units G2, and the plurality of blue pixel units B are configured to perform an image sensing operation of correlated double sampling CDS among operation timing OP1, and the image data readout circuit 120 and the visible light communication data readout circuit 130 are in an idle state Idle (operation timing OP2). However, when the sensing module 110 performs the visible light communication operation, the plurality of red pixel units R, the plurality of first green pixel units G1, the plurality of second green pixel units G2, and the plurality of blue pixel units B and the visible light communication data readout circuit 130 are configured to perform the visible light communication operation VLC among the operation timing OP2, and the image data readout circuit 120 is configured to perform the analog-to-digital conversion operation ADC among the operation timing OP1.

In other words, the readout operation of the image sensing data requires more time to convert the sensing result provided by the pixel unit, but the pixel unit can directly sense the visible light communication data and quickly read out the visible light communication data by the visible light communication data readout circuit 130. In this manner, the sensing module 110 of the embodiment alternately performs the correlated double sampling CDS and the visible light communication operation VLC in the same frame time, and the visible light communication sensor 100 can simultaneously output the visible light communication data and the image sensing data. For example, in an embodiment, the period length T1 for the sensing module 110 to perform the image sensing operation of correlated double sampling CDS may be 6 μs, and the period length T2 for the image data readout circuit 120 to perform the analog-to-digital conversion operation ADC and for the sensing module 110 to perform the visible light communication operation VLC can also be 6 μs. Moreover, the period in which the image data readout circuit 120 performs the analog-to-digital conversion operation ADC is overlapped with the period in which the sensing module 110 performs the visible light communication operation VLC, and the sensing module 110 alternately performs (for example, alternate in the same frame time) the image sensing operation of correlated double sampling CDS and the visible light communication operation VLC. Therefore, the visible light communication sensor 100 of the embodiment can simultaneously output the visible light communication data and the image sensing data.

Referring to FIG. 2, in the second embodiment, a portion of the plurality of pixel units of the sensing module 110 can be coupled to the image data readout circuit 120, respectively. The image data readout circuit 120 can be configured to read out the image sensing result of the portion of the plurality of pixel units of the sensing module 110. In the second embodiment, the other portion of the plurality of pixel units of the sensing module 110 can be coupled to the visible light communication data readout circuit 130, respectively. The visible light communication data readout circuit 130 can be configured to read out the sensing result of the visible light communication signal of the other portion of the plurality of pixel units of the sensing module 110.

Figure 4:
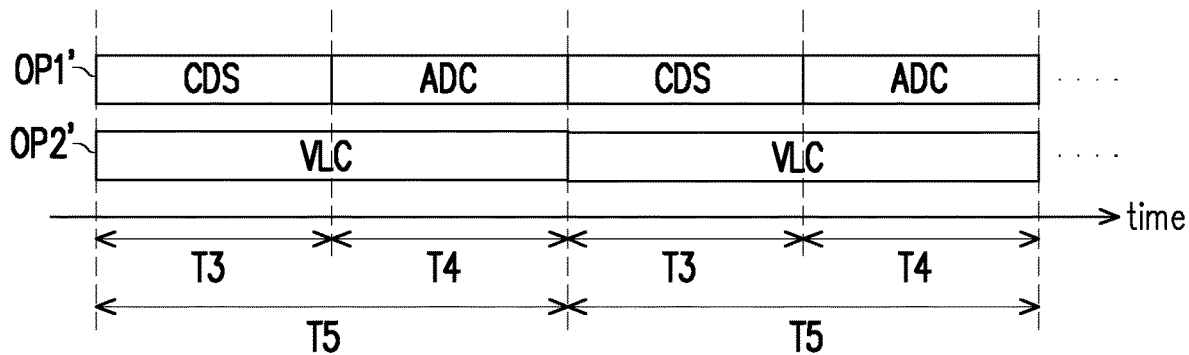
FIG. 4 is a timing diagram of performing an image sensing operation and a visible light communication operation according to a second embodiment of the present disclosure.

Further, FIG. 4 is a timing diagram of performing an image sensing operation and a visible light communication operation according to a second embodiment of the present disclosure. Referring to FIG. 2 and FIG. 4, in the second embodiment, the plurality of red pixel units R, the plurality of first green pixel units G1, and the plurality of blue pixel units B are configured for image sensing operation, and the plurality of second green pixel units G2 are configured for visible light communication signal sensing operation. Therefore, the sensing module 110 can simultaneously perform the image sensing operation and the visible light communication operation. When the plurality of red pixel units R, the plurality of first green pixel units G1, and the plurality of blue pixel units B of the sensing module 110 perform the image sensing operation of correlated double sampling CDS among the operation timing OP1', the plurality of second green pixel units G2 and the visible light communication data readout circuit 130 perform the visible light communication operation VLC among the operation timing OP2. However, when the image sensing operation of correlated double sampling CDS is finished, the image data readout circuit 120 performs the analog-to-digital conversion operation ADC among the operation timing OP1, and the plurality of second green pixel units G2 and the visible light communication data readout circuit 130 can continuously perform the visible light communication operation VLC among the operation timing OP2. In addition, the plurality of red pixel units R, the plurality of first green pixel units G1, and the plurality of blue pixel units B may be in an idle state.

In other words, since the image sensing operation and the visible light communication signal sensing operation are respectively performed by different pixel units in the sensing module 110, the period length T3 for a portion of the pixel units of the sensing module 110 to perform the image sensing operation of correlated double sampling CDS is overlapped with the period length T5 for the other portion of the pixel units of the sensing module 110 to perform the visible light communication operation VLC, and the period length T4 for the image data readout circuit 120 to perform the analog-to-digital conversion operation ADC is also overlapped with the period length T5 for the other portion of the pixel units of the sensing module 110 to perform the visible light communication operation VLC. For example, in an embodiment, the period length T3 of the image sensing operation of correlated double sampling CDS and the period length T4 of the analog-to-digital conversion operation ADC may be 6 μs, and the visible light communication operation VLC may be 12 μs. Moreover, the period for the image data readout circuit 120 to perform the analog-to-digital conversion operation ADC is overlapped with the period for the sensing module 110 to perform the visible light communication operation VLC. Therefore, the visible light communication sensor 100 of the embodiment can simultaneously output the visible light communication data and the image sensing data.

Figure 5:
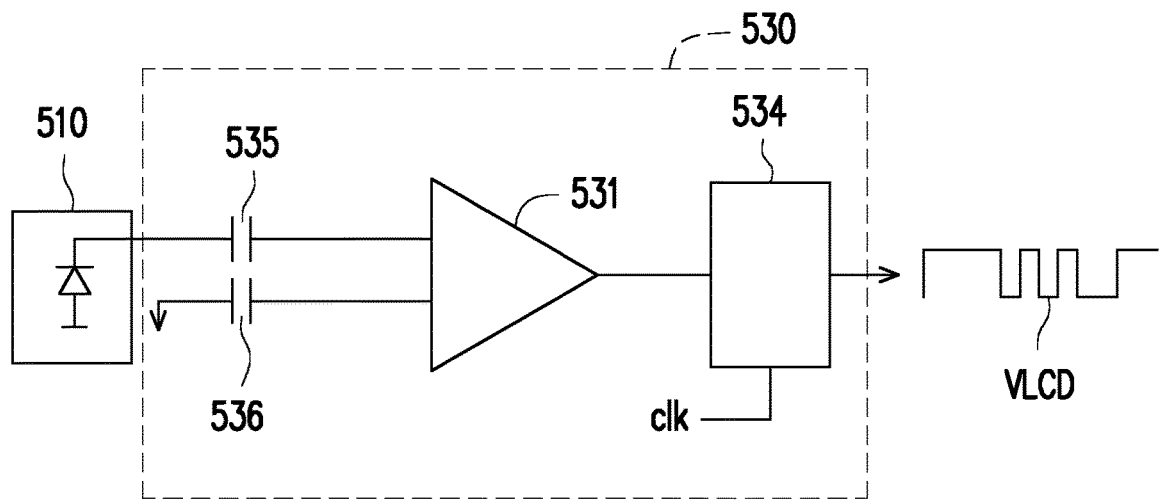
FIG. 5 is a schematic circuit diagram of a visible light communication data readout circuit according to an embodiment of the disclosure.

FIG. 5 is a schematic circuit diagram of a visible light communication data readout circuit according to an embodiment of the disclosure. Referring to FIG. 5, a visible light communication data readout circuit 530 includes a comparator 531, a synchronization circuit 534, and capacitors 535 and 536. In this embodiment, the visible light communication data readout circuit 530 is coupled to a portion of a plurality of pixel units of the sensing module 510. When the sensing module 510 performs the visible light communication operation, the first input terminal of the comparator 531 receives the visible light communication signal provided by a portion of the plurality of pixel units of the sensing module 510 through the capacitor 535. The second input terminal of the comparator 531 receives a reference voltage through the capacitor 536. In this embodiment, the comparator 531 outputs a comparison result signal to the synchronization circuit 534 according to the voltage values of the first input terminal and the second input terminal. The synchronization circuit 534 receives the clock signal clk to generate a visible light communication data VLCD according to the comparison result signal and the clock signal clk. Therefore, the visible light communication data readout circuit 530 of the present embodiment can accurately read out the visible light communication data VLCD corresponding to the visible light communication signal sensed by the sensing module 510.

In summary, the visible light communication sensor of the present disclosure can receive the visible light communication signal by using a portion of the plurality of pixel units of the image sensor, and receive the image sensing signal by using another portion of the plurality of pixel units, thereby providing the image sensing function and the visible light communication function simultaneously or by time division. In this manner, the visible light communication sensor of the present disclosure can effectively and accurately sense visible light signals.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A visible light communication sensor, comprising:
   a sensing array, comprising a plurality of pixel units arranged in an array;
   an image data readout circuit, coupled to a first portion of the plurality of pixel units; and
   a visible light communication data readout circuit, coupled to a second portion of the plurality of pixel units, wherein
   when the sensing array performs an image sensing operation, the first portion of the plurality of pixel units performs image sensing, and the image data readout circuit is idle, when the sensing array performs a visible light communication operation, the second portion of the plurality of pixel units receives a visible light communication signal, so that the visible light communication data readout circuit outputs a visible light communication data, and the image data readout circuit performs an analog-to-digital conversion on a plurality of image sensing signals outputted by the first portion of the plurality of pixel units to output an image sensing data, wherein the visible light communication data readout circuit comprises a comparator and a synchronization circuit, and the synchronization circuit is coupled to an output terminal of the comparator, wherein the second portion of the plurality of pixel units is coupled to a first input terminal of the comparator, and when the sensing array performs the visible light communication operation, the second portion of the plurality of pixel units outputs a plurality of visible light sensing signals to the comparator according to the visible light communication signal, so that the comparator and the synchronization circuit can read out the visible light communication data.

2. The visible light communication sensor of claim 1, wherein the first portion of the plurality of pixel units comprises the second portion of the plurality of pixel units, and the sensing array alternately performs the image sensing operation and the visible light communication operation.

3. The visible light communication sensor of claim 2, wherein the sensing array alternately performs the image sensing operation and the visible light communication operation in the same frame time.

4. The visible light communication sensor of claim 2, wherein the visible light communication sensor simultaneously outputs the visible light communication data and the image sensing data.

5. The visible light communication sensor of claim 2, wherein the first portion of the plurality of pixel units is a plurality of first color type pixels, and the second portion of the plurality of pixel units is a portion of the plurality of first color type pixels.

6. The visible light communication sensor of claim 1, wherein the first portion of the plurality of pixel units and the second portion of the plurality of pixel units operate independently of each other, and a period for the image data readout circuit to perform the analog-to-digital conversion operation is overlapped with a period in which the visible light communication operation is performed.

7. The visible light communication sensor of claim 6, wherein the first portion of the plurality of pixel units is a portion of a plurality of first color type pixels, and the second portion of the plurality of pixel units is another portion of the plurality of first color type pixels.

* * * * *